United States Patent [19]

Merryman

[11] 4,101,761
[45] Jul. 18, 1978

[54] TIMING PULSE GENERATOR

[75] Inventor: Wayne R. Merryman, Lafayette, Calif.

[73] Assignee: Pacific Western Systems, Mountain View, Calif.

[21] Appl. No.: 745,283

[22] Filed: Nov. 26, 1976

[51] Int. Cl.² .............................................. G06M 3/02
[52] U.S. Cl. ........................... 235/92 CA; 235/92 MS; 235/92 PE; 235/92 R; 328/63
[58] Field of Search ....... 235/92 MT, 92 CA, 92 CC, 235/92 PE, 92 LG, 92 DE, 92 MS; 328/63, 55, 56

[56] References Cited

U.S. PATENT DOCUMENTS

| 3,371,334 | 2/1968 | Asher et al. | 235/92 CA |
| 3,569,677 | 3/1971 | Bray et al. | 235/92 CA |
| 3,824,378 | 7/1974 | Johnson et al. | 235/92 CA |
| 3,840,174 | 10/1974 | Craft | 235/92 CC |
| 3,947,664 | 3/1976 | Cox et al. | 235/92 CC |
| 3,981,440 | 9/1976 | Richardson | 235/92 CC |

Primary Examiner—Joseph M. Thesz
Attorney, Agent, or Firm—Harry E. Aine; Harvey G. Lowhurst

[57] ABSTRACT

A timing pulse generator for testing electronic components such as semiconductor memories, which tests require time accuracy and repeatability.

A number of registers are provided for registering digital words which correspond to timing pulses to be generated. Each word includes information in a first portion as to the coarse start time of a particular pulse and information in a second portion as to the fine start time of the pulse. A counter circuit is provided with means for starting and stepping the counter in pedetermined increments through a plurality of states. A digital comparator compares the state of the counter with the coarse start time portion of the word stored in the register and generates an output pulse when the two coincide. A digitally controlled variable delay circuit is provided corresponding to each register. An output from the register corresponding to the fine start time portion of the word sets the amount of delay introduced by the delay circuit. The output pulse from the digital comparator is applied to the delay circuit such that the pulse is delayed by an amount determined by the fine start time information in the word stored in the register. The counter start control means enables automatic switching between triggered and gated modes for single cycle or continuous cycle operation of the counter without false triggering of the counter.

7 Claims, 7 Drawing Figures

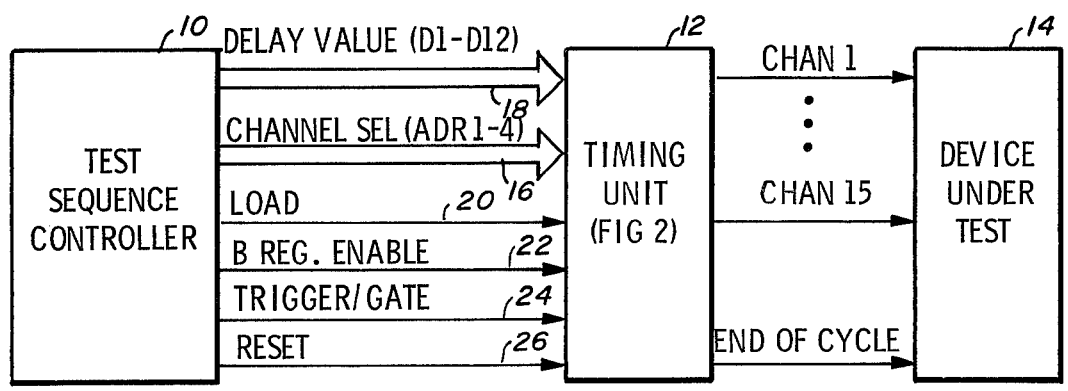
Fig_1
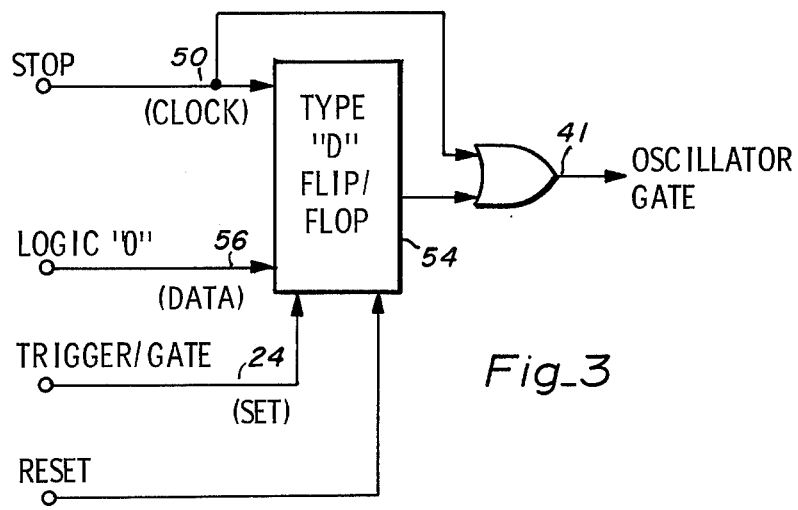
Fig_3
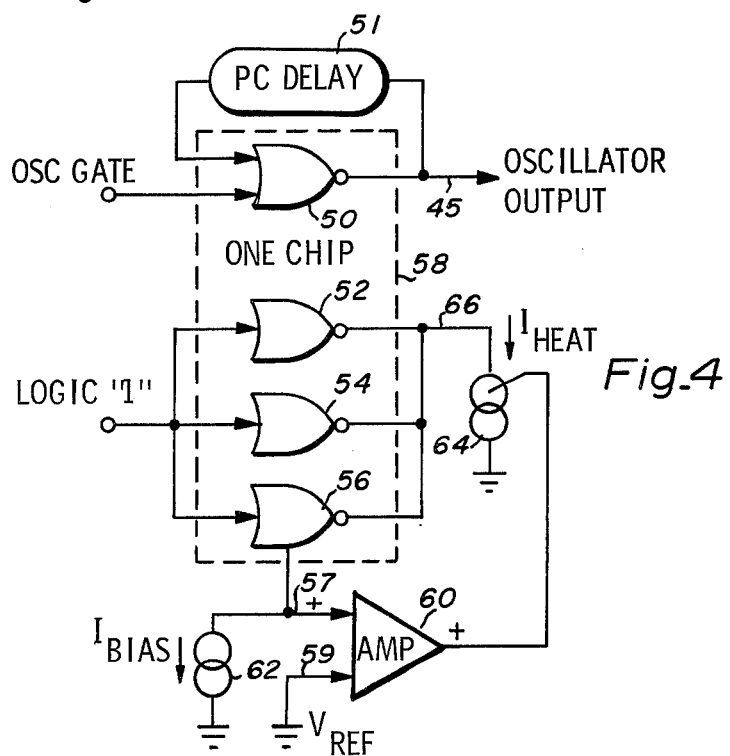
Fig_4

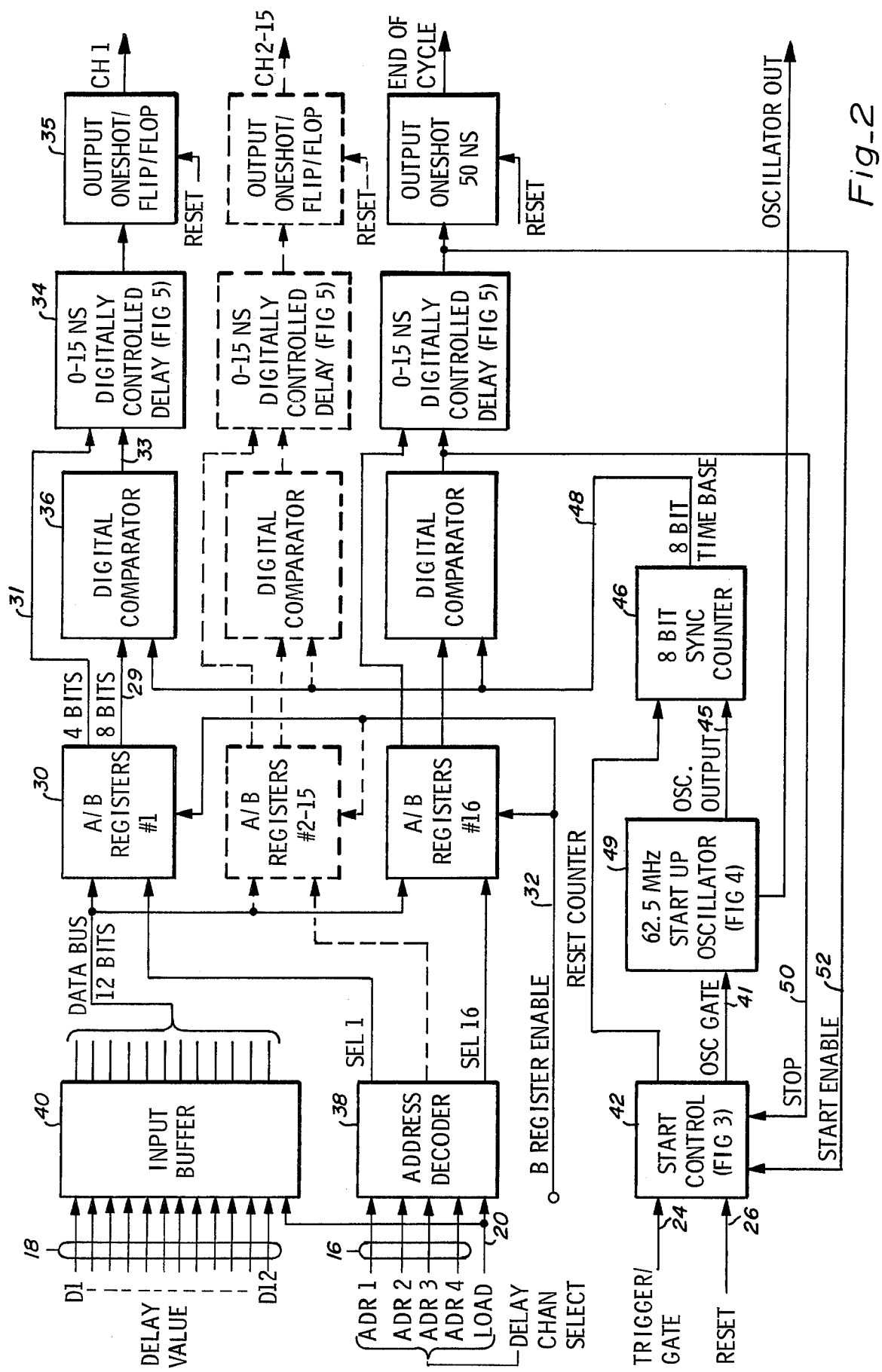
Fig_2

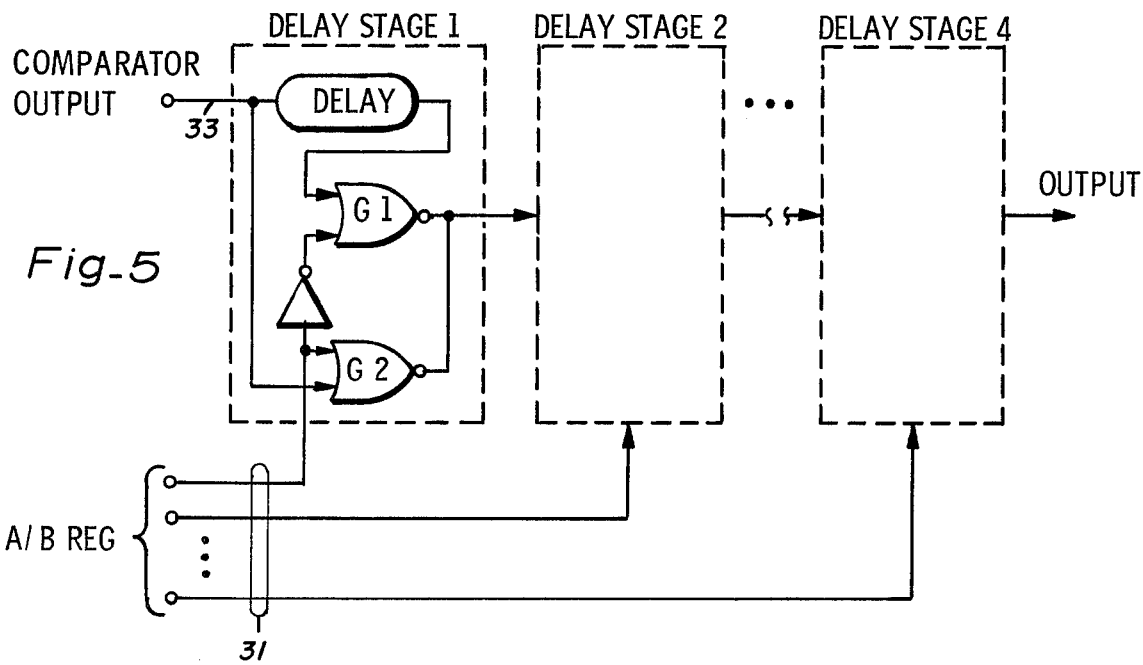
Fig_5
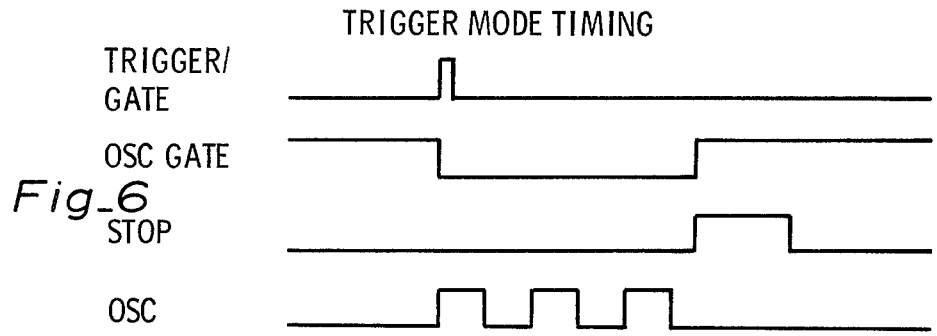
Fig_6
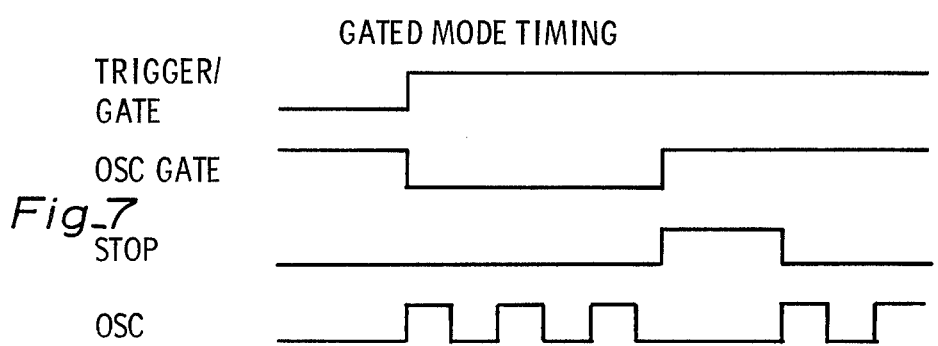
Fig_7

TIMING PULSE GENERATOR

BACKGROUND OF THE INVENTION

1. Field of the Invention

The invention relates to timing circuits and more particularly to timing circuits utilized in multiphase testing of electronic components.

2. Description of the Prior Art

Prior timing circuits do not provide accurate, closely spaced multiple channel pulses with negligible duty factory effects. Prior circuits do not allow for selective digital control of the delay times in a plurality of channels. Furthermore, prior circuits do not allow for timing changes on a cycle-to-cycle basis without adversely affecting the timing accuracy.

SUMMARY OF THE INVENTION

It is a primary object of this invention to provide a time generating system for circuit component testing which includes a number of timing channels in which the delay times are digitally controlled.

It is a further object of this invention to provide a time generating system in which the time pulses generated can be changed on a cycle-to-cycle basis, the starting time for each cycle being triggered by an external source or by completion of a preceding timing cycle.

It is a further object of this invention to provide a start up oscillator for use in a timing system, which oscillator is temperature controlled to provide for temperture stability in the timing system.

Briefly, the above objects are accomplished in accordance with the invention by providing a time generator system which is comprised of a plurality of time interval generating channels. Each channel is comprised of a digitally controlled delay circuit to provide for a changeable delay in response to a digital input. Each channel is driven from a time zero pulse which is generated from a common start up oscillator, associated start control circuitry, and time base generating circuitry. A multibit word is utilized to initialize each of the channels, the most significant bits designating the address of a specific channel to be initialized and the remaining data bits represent the delay required in binary notation.

Means are provided for registering the data bits. A first portion of the data bits corresponds to a coarse start time and a second portion of the data bits corresponds to a fine start time of a given timing pulse in a channel. Means are provided for starting and stepping a counter in predetermined increments through a plurality of states. A comparator compares the contents of the counter with the data bits stored in the registering means. When the coarse start time registered and the state of the counter coincide, a pulse is generated which passes through the digitally controlled delay circuit. The fine start time portion of the registered data bits is utilized to energize the delay circuit to thereby set a delay corresponding to the digital representation stored in the register.

In accordance with an aspect of the invention, an oscillator is provided that can be started instantaneously in combination with a distribution system to provide multiple channel delays with coarse timing and with a digitally controlled incremental delay subdividing an oscillator cycle to provide further fine timing for each channel.

The circuit has the advantage that it is under digital control and therefore it is useful for providing timing signals within digital logic such as found in computers.

The invention has the further advantage that it provides a number of timing channels each of whose delay times can be changed and set to nanosecond resolution with good accuracy, the accuracy being maintained between output times of all channels.

The invention has the further advantage that the time generator has negligible duty factor effect and allows the times to be changed on a cycle-to-cycle basis.

A further advantage of the invention is that a novel temperature control circuit maintains the start up oscillator at a stable temperature regardless of either duty cycle or ambient temperature changes, with a minimum amount of complexity and cost.

A further advantage of the invention is its use of digital circuitry so that analog level sensing is not needed to determine timing conditions making it possible to change any one or all of the channel time delays at the end of each cycle. This is particularly useful in the simulation of read/write cycles for a memory being tested at its rated speed.

The novel start control logic of the invention has the advantage that it allows automatic switching between triggered and gated modes without allowing false triggering.

The circuit has the further advantage that by utilizing digital circuits, the accuracy of relative timing between channels is only limited by the differential temperature effects on the digitally controlled delay gates, and the propagation difference through output one shots. The result is that there is a predetermined number of clock pulses between channel output times plus a predetermined number of interpolating intervals which are free of duty cycles and most temperature effects.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 1 is a block diagram of a test system in which the invention is embodied;

FIG. 2 is a block diagram of the timing unit of FIG. 1;

FIG. 3 is a detailed diagram of part of the logic within the start control block of FIG. 2;

FIG. 4 is a detailed diagram of the logic within the start up oscillator block of FIG. 2;

FIG. 5 is a detailed block diagram of the digitally controlled delay block of FIG. 2;

FIG. 6 is a timing diagram of the trigger mode timing of the start control logic of FIG. 2; and FIG. 7 is a timing diagram of the gated mode timing of the start control logic of FIG. 2.

DESCRIPTION

Referring to FIG. 1, a test system in which the timing unit of the present invention is embodied is shown. The test sequence controller 10 controls the flow of device test parameters. These parameters may be supplied from a prewired logic circuit or from a program controlled computer. The timing unit 12 in which the invention is embodied responds to control functions supplied by the test sequence controller 10 to provide various timed outputs which test the device 14. In the example to be described subsequently, the device under test is a semiconductor memory wherein its various functions are tested by supplying read and write signals in accordance with the specifications of the memory. Since these specifications vary from model to model, the timing unit is required to have flexibility so that a wide range of devices can be tested.

The timing unit has fifteen delay channels in which variable time pulses are produced. Additionally, an end of cycle channel is provided. The test sequence controller provides the timing unit with a four bit channel address over bus 16 to select a particular channel in which a delay time is to be specified. The delay value is introduced by means of a 12 bit word on bus 18. The delay value and address are loaded into the particular channel by energizing the load line 20. As will be described subsequently, split cycle timing is selected by the B register enable line 22. Finally, the timing unit is placed into operation by means of the trigger/gate line 24 and is reset by means of a general reset line 26.

Referring now to FIG. 2, the details of the timing unit 12 of FIG. 1 are shown. Sixteen channels are shown. Each channel has an A/B register 30 which comprises two registers each capable of storing a 12 bit word. When the B register enable line 32 is energized, the B register is selected. Otherwise, the A register is selected. Four bits on line 31 from the registers 30 drive a digitally controlled delay circuit 34 shown in more detail in FIG. 5. Eight bits from the output 29 of register 30 drive a digital comparator 36.

Parameters defining the time of occurrence of a pulse are placed in the A or B register of a selected channel by first decoding an address which is loaded by means of a load line 20 into the address decoder 38. The output of the address decoder is one of sixteen select lines (select 1–16) which select one of the channels. The delay value to be loaded into the particular channel selected is stored in input buffer register 40, via delay value bus 18 from the test sequence controller. The output 42 of the input buffer is a 12 bit data bus which drives all of the registers 30 in parallel.

Once all of the channels have been loaded with parameters defining the timing sequences desired, the circuit is ready to be started for the test sequence. A start control circuit 42 is provided which controls a start up oscillator 44, which when placed in operation steps an eight bit synchronous counter 46. The output 48 of the counter is an 8-bit time base which drives in parallel inputs to the digital comparators 36 in each channel.

The circuit of FIG. 2 operates as follows. When the start control logic 42 detects a start condition, that is when the trigger/gate 24 goes positive, the start up oscillator 44 is enabled. The start up oscillator produces evenly spaced, 16 NS time marks 45 which are counted by the synchronous counter 46. The output 48 of the counter is digitally compared by the comparators 36 in each channel with the contents of the corresponding register 30 in that channel. The comparator outputs a pulse when the coarse time interval specified by the corresponding A/B register 30 is reached. This pulse is then delayed through the digitally controlled delay lines 34 which provide interpolating steps of fine time delay information between cycles of the start up oscillator. Thus, the start up oscillator and eight bit counter provide a coarse time base, whereas the digitally controlled delays provide a fine time base.

The sixteenth channel provides a stop pulse 50 to inhibit the start up oscillator when the channel 16 counts out its delay steps. After the comparators output pulse has propagated through the digitally controlled delay in channel 16, the start control logic is enabled via line 52. If external triggering is the mode of operation, the next trigger pulse will start the sequence again (see FIG. 6). If a gated mode operation is utilized, the internal clocking will restart the cycle automatically from the enable line 52 (see FIG. 7). Since all of the channels of this system use the same basic circuits for the registers, comparator and digitally controlled delay, the accuracy of relative timing between channels is only limited by the differential temperature affects on the digitally controlled delay gates and by the propagation differences through the output one shots 35. The result is a circuit in which a number of clock pulses can be selected between channel output times in addition to a number of interpolating intervals which are digitally selected.

Referring to FIG. 3, a portion of the start control logic 42 is shown. This circuit allows automatic switching between triggered and gated modes without allowing false triggering. The flip-flop 54 is initially reset to its normal state. A start signal from either an external source or from the start enable line 52, through logic circuitry not shown, energizes the trigger/gate line 24 which sets the flip-flop ON. This causes an output on the oscillator gate line 41 which starts up the oscillator. When a system cycle is completed, a stop pulse 50 is generated by the digital comparator in channel 16, which clocks the flip-flop to its reset mode provided a gate signal is not present on the set input 24. If the set input is positive, the flip-flop will not change state and a new cycle is immediately commenced. If the set input is being removed when the stop pulse occurs, the internal logic at the flip-flop will resolve the race condition before the stop pulse ends. Thus under this condition, the gate signal to the oscillator cannot jitter or cause a false start-oscillator operation. The stop pulse is specified to be at least one start oscillator pulse width wide to thus resynchronize the oscillator for the start of the next cycle.

Referring now to FIG. 4, the start up oscillator 44 of FIG. 2 is shown in more detail. The oscillator is comprised of a NOR gate 50 whose output is fed back through a printed circuit delay 51 to one input to the NOR. The delay 51 is a printed circuit strip on the printed circuit board. In order to stabilize the oscillator, a novel temperature control circuit is utilized. The oscillator 50 is in an integrated circuit which is composed of a number of NOR gates on a single chip 58. NOR gates 52, 54, 56 comprise additional NOR gates for temperature control. These NOR gates are used as heat generators and have their inputs tied permanently to a logical one. The temperature of the chip is sensed as a voltage from the NOR gate 56. The noninverting output 57 of the NOR gate 56 drives one leg of an amplifier 60. The other leg 59 is connected to a reference voltage ($V_{ref}$). A current generator 62 is connected to the noninverting output 57 so as to create a small bias current ($I_{bias}$). By creating this small bias current, the circuit is able to sense the temperature at which the chip is operating because the voltage at the output 57 is a function of temperature. The voltage 57 is compared against the reference 59 and a current is drawn by means of the variable current generator 64 connected to the output 66 of the three NOR gates. Consequently, the temperature at which the oscillator 50 operates is controlled by controlling the power consumed by the three NOR gates 52, 54, and 56. Thus the temperature at which the chip 58 operates is varied to maintain the temperature constant by means of the feedback loop.

Referring now to FIG. 5, the detailed logic within the digitally controlled delay block 34 of FIG. 2 is shown. This circuit, as well as a one-shot circuit suitable for use in the circuit of FIG. 2, is described in a technical paper entitled "Timing Systems in the Nanosecond Domain" by W. Merryman, presented at the 1974 Western Electronic Show and Convention. Four delay stages are illustrated in FIG. 5. One of the four bits 31 from the A/B register drives an input to each of the delay stages. The A/B register will either enable gate G1 or gate G2 depending upon whether the A/B register output is positive, or negative, respectively. If G1 is enabled, the signal on line 33 is delayed through the delay line and hence the output is delayed. If G2 is enabled, the input is not delayed, in effect allowing the delay time to be switched in and out under control of the A/B register. Depending upon the combination of signals on the input lines 31 and the amount of delay provided in each stage various combinations of total delay can be chosen under control of the A/B register. For example, if a binary coded value for the delay is chosen such that the four stages have one, two, four, and eight nanoseconds of delay respectively, then by utilizing a binary coded number to energize the lines 31 any delay from zero to fifteen nanoseconds can be digitally selected.

SPLIT CYCLE TIMING

In many applications, it is desirable to be able to switch from one set of timing parameters to a completely different set of timing parameters instantaneously. This type of split cycle operation is utilized for testing semiconductor memories wherein read and write cycles follow one another. During a read cycle, lines such as write enable, and data input need not be energized whereas during a write cycle these lines would be energized. Furthermore, during a read cycle an error strobe line would be energized whereas it is not present during a write cycle. Split cycle timing is accomplished as follows. Two registers A and B are provided within the logic block 30 of FIG. 2. The A register is selected for input information from the input buffer 40 when the B register enable line 32 is negative. The B register is selected when the line 32 is positive. The outputs of the registers are similarly gated by the B register enable line 32 so that when this line is negative the contents of the A register appear at the output buses 29 and 31 and are presented to the digital comparator 36 and the digitally controlled delay 34. When the B register enable line is positive, the contents of the B register appears at the output buses 29 and 31. Of course, it will be understood by those skilled in the art that any number of different timing parameters can be chosen for additional cycles by merely duplicating the number of registers within the logic block 30 and providing for appropriate additional enable controls 32. Split cycle operation is initiated by selecting the appropriate level of B register enable line 32 prior to starting a cycle by means of trigger/gate line 24.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. In a timing circuit:
register means for registering a word having a first portion and a second portion and for providing said word at an output of said registering means;
a counter for providing an output;
clock means stepping said counter in predetermined increments of time through a plurality of states;
comparator means responsive to said counter output and to said first word portion of said output of said registering means for comparing said first portion of said word and the state of said counter and for generating a comparator output at an output of said comparator means when the two coincide; and
variable delay means having a plurality of predetermined selectable incremental delay values of time independent of said time increments of said clock means, said incremental delay values of time being of shorter duration than the time increments of said clock means and being responsive to the output of said comparator means and to said second portion of said output word of said register means for selecting the incremental value of said delay in accordance with information in said second portion of said word and for producing a timing pulse output at the end of said selected incremental amount of said delay
the starting time of said timing pulse output being thereby specified by information in said first portion of said word output of said register means and as further incrementally delayed in accordance with information in said second portion of said word.

2. The combination in accordance with claim 1 wherein said registering means further comprises at least two registers, each register capable of storing a word and enabling means for activating only one of said registers at a time for providing the word stored in said one register at said output of said registering means.

3. The apparatus of claim 1 wherein said variable delay means comprises a plurality of serially arranged delay stage means each delay stage means providing a predetermined incremental delay value when enabled, and said serially arranged delay stage means being selectively enabled by information in said second portion of said output word of said registering means.

4. The apparatus of claim 3 wherein individual ones of said delay stage means includes a printed circuit delay element having a predetermined incremental value of time delay and means responsive to information in said second portion of said output word of said registering means for selectively enabling respective ones of said delay stage means.

5. In a timing system for generating a plurality of timed pulses comprising:
a plurality of channels, each channel comprising means for registering a word having a first portion and a second portion;
a counter for providing an output;
clock means for stepping said counter in predetermined increments of time through a plurality of states;
comparator means in each of said channels responsive to said counter and said registering means within said channel for comparing said first portion of said word with the state of said counter and for generating a pulse when the two coincide; and delay means in each channel having a plurality of of predetermined selectable incremental delay values of time independent of said time increments of a clock means, said incremental delay values of time being of shorter duration than the time increments of said clock means and being responsive to the output of said comparator means and to said second portion of said output word of said register means for selecting the incremental value of said delay in accordance with information in said second portion of word and for producing a timing pulse output at the end of said selected incremental amount of said delay, the starting time of said timing pulse being thereby specified by information in said first portion of said word output of said register means and as further incrementally delayed in accordance with information in said second portion of said word.

6. The combination in accordance with claim 5 wherein said stepping means includes starting means and wherein at least one of said channels is connected to said starting means to thereby initiate the restarting of said starting means at a predetermined time.

7. The combination in accordance with claim 6 wherein said starting means includes:

a flip-flop having a first input for turning said flip-flop ON, a second input for tuning said flip-flop OFF, and an output;

means connected to said first input for turning on said flip-flop from an external trigger source and from said one channel;

a stop signal line connected to said second input for turning OFF said flip-flop when said stop signal line is energized;

means for combining said stop line with the output of said flip-flop to produce a gate signal upon the conditions that said flip-flop is on and said stop signal line is disenergized; and wherein said stepping means further comprises:

a gated oscillator having a gate input connected to the gate signal produced by said combining means.

* * * * *